(12) United States Patent
Hayashi et al.

(10) Patent No.: US 9,062,846 B2
(45) Date of Patent: Jun. 23, 2015

(54) LINEAR LIGHT SOURCE APPARATUS

(75) Inventors: Kinji Hayashi, Kiyosu (JP); Hitoshi Omori, Kiyosu (JP)

(73) Assignee: Toyoda Gosei, Co., Ltd., Kiyosu-Shi, Aichi-Ken (JP)

( * ) Notice: Subject to any disclaimer, the term of this patent is extended or adjusted under 35 U.S.C. 154(b) by 364 days.

(21) Appl. No.: 13/619,086

(22) Filed: Sep. 14, 2012

(65) Prior Publication Data

US 2013/0077295 A1    Mar. 28, 2013

(30) Foreign Application Priority Data

Sep. 27, 2011    (JP) .................................. 2011-211167

(51) Int. Cl.

| | |
|---|---|
| *F21V 7/00* | (2006.01) |
| *F21V 29/00* | (2015.01) |
| *F21V 21/005* | (2006.01) |
| *F21K 99/00* | (2010.01) |
| *F21S 4/00* | (2006.01) |
| *F21V 7/04* | (2006.01) |
| *F21V 17/06* | (2006.01) |
| *H01L 33/00* | (2010.01) |
| *H05K 1/02* | (2006.01) |

(Continued)

(52) U.S. Cl.
CPC . *F21V 7/00* (2013.01); *F21V 29/00* (2013.01); *F21V 21/005* (2013.01); *F21V 29/004* (2013.01); *F21K 9/00* (2013.01); *F21S 4/008* (2013.01); *F21V 7/04* (2013.01); *F21V 17/06* (2013.01); *H01L 33/00* (2013.01); *F21Y 2101/02* (2013.01); *F21Y 2103/003* (2013.01); *H05K 1/0271* (2013.01); *H05K 3/0061* (2013.01); *H05K 3/284* (2013.01); *H05K 2201/09036* (2013.01); *H05K 2201/10106* (2013.01); *H05K 2203/1316* (2013.01); *H05K 2203/1327* (2013.01); *H01L 25/0753* (2013.01)

(58) Field of Classification Search
CPC ......... F21V 21/005; F21V 7/00; F21V 29/00; F21S 4/03
USPC ............... 362/217.05, 217.07, 218, 219, 221, 362/249.01, 249.02, 267, 294, 345, 373, 362/614
See application file for complete search history.

(56) References Cited

U.S. PATENT DOCUMENTS 5,433,024 A * 7/1995 Lerner .......................... 40/546
7,455,441 B2    11/2008 Chosa et al.

(Continued)

FOREIGN PATENT DOCUMENTS

| JP | 2004-235139 A | 8/2004 |
|---|---|---|
| JP | 2006-120691 A | 5/2006 |
| JP | 2008-053571 A | 3/2008 |

*Primary Examiner* — Thomas M Sember

(74) *Attorney, Agent, or Firm* — McGinn IP Law Group, PLLC

(57) ABSTRACT

The linear light source apparatus includes an elongated rectangular wiring substrate; a plurality of light-emitting devices which are aligned on a straight line on the top surface of the wiring substrate; reflectors provided on the top surface such that each reflector corresponds to one light-emitting device; a sealing resin portion which seals each of the light-emitting devices; and a heat radiation sheet provided on the bottom surface of the wiring substrate. A plurality of grooves are provided on the bottom surface of the substrate. Each groove is formed so as to have a line shape and to extend in a lateral direction of the wiring substrate. Each of the grooves is located between adjacent light-emitting devices. The heat radiation sheet is provided on the entire bottom surface of the wiring substrate.

16 Claims, 3 Drawing Sheets

(51) Int. Cl.
*F21Y 101/02* (2006.01)
*F21Y 103/00* (2006.01)
*H05K 3/00* (2006.01)
*H05K 3/28* (2006.01)
*H01L 25/075* (2006.01)

(56) References Cited

U.S. PATENT DOCUMENTS

2007/0109792 A1    5/2007  Chosa et al.
2010/0053956 A1*   3/2010  Park et al. .................. 362/235

* cited by examiner

LINEAR LIGHT SOURCE APPARATUS

BACKGROUND OF THE INVENTION

1. Field of the Invention

The present invention relates to a light source apparatus in which a plurality of light-emitting devices are aligned linearly, and which is employed as, for example, a backlight source of a small-sized liquid crystal display panel.

2. Background Art

A light source including a light guide plate and a linear light source apparatus (see, for example, Patent Document 1) provided on a side surface of the light guide plate has been known as a backlight source of the liquid crystal display panel of a cellular phone or a digital camera.

This linear light source apparatus includes an elongated rectangular printed board having thereon a wiring pattern; a plurality of light-emitting devices which are provided on the printed board so as to be separated from one another along a longitudinal direction of the printed board, and which are connected to the wiring pattern of the printed board; reflectors each having an inclined surface and which are provided on the two longitudinal sides of each light-emitting device; and a sealing resin portion which seals each of the light-emitting devices.

When the sealing resin portion of this linear light source apparatus is thermally cured, shrinkage occurs, and the light source apparatus warps so as to be convex downward (i.e., in a direction from the surface of the printed board on which the light-emitting devices are mounted toward the opposite surface of the printed board). Therefore, adhesion between the linear light source apparatus and the light guide plate is lowered, and the performance of light incidence to the light guide plate is reduced.

Patent Document 2 discloses a technique for preventing warpage of such a linear light source apparatus, in which a reflector corresponding to a light-emitting device and a reflector corresponding to another adjacent light-emitting device are discontinuously provided so as to be separated from each other by a groove formed therebetween. This groove relaxes stress caused by shrinkage of the sealing resin portion, and prevents warpage of the light source apparatus.

Patent Document 3 discloses a linear light source apparatus having a configuration similar to that of the linear light source apparatus disclosed in Patent Document 1, except that the reflectors are omitted, and a second substrate which is longer than each sealing resin portion in a longitudinal direction is provided on the bottom surface of the printed board (i.e., the surface opposite the surface on which the light-emitting devices are mounted) at a position corresponding to each light-emitting device such that each end of the second substrate is located between adjacent sealing resin portions. This patent document describes that torsion or warpage of the linear light source apparatus can be reduced by means of the second substrate.

Patent Document 1: Japanese Patent Application Laid-Open (kokai) No. 2004-235139
Patent Document 2: Japanese Patent Application Laid-Open (kokai) No. 2006-120691
Patent Document 3: Japanese Patent Application Laid-Open (kokai) No. 2008-53571

However, the technique disclosed in Patent Document 2 may fail to exhibit a sufficient effect of preventing warpage of the light source apparatus. Therefore, there may arise problems in that adhesion between the light source apparatus and a light guide plate is lowered due to warpage of the apparatus; the performance of light incidence to the light guide plate is reduced; and the brightness of a backlight source is lowered. Even when the technique disclosed in Patent Document 3 is applied to the linear light source apparatus disclosed in Patent Document 2, warpage of the linear light source apparatus is not sufficiently suppressed.

SUMMARY OF THE INVENTION

In view of the foregoing, an object of the present invention is to provide a linear light source apparatus in which warpage is more effectively prevented.

In a first aspect of the present invention, there is provided a linear light source apparatus comprising a wiring substrate with a rectangular shape on a top surface of which a wiring pattern is formed; a plurality of light-emitting devices which are provided on the top surface of the wiring substrate so as to align along a longitudinal direction of the wiring substrate, and which are connected to the wiring pattern of the wiring substrate; a sealing resin portion which seals each light-emitting device; a groove formed on a bottom surface of the wiring substrate, which bottom surface is opposite the top surface on which the light-emitting devices are provided, and each groove being located between adjacent light-emitting devices; and a reinforcing sheet is provided on the bottom surface.

Each groove may have any shape, such as a dot shape or a line shape. From the viewpoint of easy formation of the groove, the groove preferably has a line shape. When a line-shaped groove is formed, the cross section of the groove in a direction perpendicular to the line may assume any shape such as a rectangular shape, a triangular shape, or a semicircular shape. When a line-shaped groove is formed, preferably, the line extends in a lateral direction. This is because, in this case, stress can be more effectively relaxed, and warpage of the linear light source apparatus can be suppressed. No particular limitation is imposed on the grooves, so long as they are located on the bottom surface of the wiring substrate, and at least one groove is provided between adjacent light-emitting devices. Preferably, a plurality of grooves are provided so as to be symmetrical with respect to the center of the wiring substrate. In this case, stress can be more effectively relaxed, and warpage of the linear light source apparatus can be suppressed. When the wiring substrate is formed of a single layer, the depth of each groove is preferably ⅓ or less the thickness of the substrate. Meanwhile, when the wiring substrate is formed of a plurality of layers, the depth of each groove is preferably equal to or smaller than the thickness of the first layer on the bottom side of the wiring substrate. In the case where each groove has a depth greater than this, the strength of the wiring substrate may be lowered, and breakage, etc. may occur. In such a case, when the wiring substrate is a multi-layer substrate, a wiring pattern provided in the substrate may be damaged, which is not preferred. The grooves are formed by means of, for example, a dicer, a cutter, or etching.

No particular limitation is imposed on the reinforcing sheet, so long as it relaxes stress generated in the linear light source apparatus. Preferably, the reinforcing sheet is a heat radiation sheet formed of a material having thermal conductivity higher than that of the wiring substrate. Examples of the material of the heat radiation sheet include aluminum, copper, and an alloy predominantly containing aluminum or copper. The reinforcing sheet is preferably provided on the entire bottom surface of the wiring substrate.

The linear light source apparatus may comprise reflectors provided on the top surface of the wiring substrate on which the light-emitting devices are provided, each of the reflectors being formed of two units whose respective inclined surfaces face each other in a longitudinal direction of the wiring substrate, and which are separated from each other such that one or more light-emitting devices are provided between the two inclined surfaces. By means of the reflectors, light radiated in a horizontal direction of the wiring substrate can be effectively extracted upward. When the reflectors are provided, the sealing resin portion is formed so as to fill a space defined by the two inclined surfaces of each reflector and the top surface of the wiring substrate on which the light-emitting devices are provided. Adjacent reflectors may be joined integrally, or joined to each other by the mediation of a rib.

A second aspect of the present invention is drawn to a specific embodiment of the linear light source apparatus according to the first aspect, wherein the grooves are provided so as to be symmetrical with respect to the center of the wiring substrate.

A third aspect of the present invention is drawn to a specific embodiment of the linear light source apparatus according to the first or second aspect, wherein each groove extends in a lateral direction of the wiring substrate and has a line shape.

A fourth aspect of the present invention is drawn to a specific embodiment of the linear light source apparatus according to any of the first to third aspects, wherein the reinforcing sheet is a heat radiation sheet having thermal conductivity higher than that of the wiring substrate.

A fifth aspect of the present invention is drawn to a specific embodiment of the linear light source apparatus according to any of the first to fourth aspects, which further comprises reflectors provided on the top surface of the wiring substrate, each of the reflectors being formed of two units whose respective inclined surfaces face each other in a longitudinal direction of the wiring substrate, and which are separated from each other such that one or more light-emitting devices are provided between the two inclined surfaces, wherein the sealing resin portion is formed so as to fill a space defined by the two inclined surfaces of each reflector and the top surface of the wiring substrate on which the light-emitting devices are provided.

A sixth aspect of the present invention is drawn to a specific embodiment of the linear light source apparatus according to the fifth aspect, wherein adjacent reflectors are joined to each other.

A seventh aspect of the present invention is drawn to a specific embodiment of the linear light source apparatus according to the sixth aspect, wherein the reflectors are joined by the mediation of a rib.

According to the first aspect of the present invention, since grooves are formed on the bottom surface of the wiring substrate of the linear light source apparatus and each groove is located between adjacent light-emitting devices, and the reinforcing sheet is provided on the bottom surface of the wiring substrate, stress generated in the wiring substrate, which is caused by thermal shrinkage of the sealing resin portion, can be relaxed, and warpage of the linear light source apparatus can be suppressed. Thus, since warpage of the linear light source apparatus is suppressed, when a surface light source apparatus is produced by combining the linear light source apparatus with a light guide plate, adhesion between the linear light source apparatus and the light guide plate is enhanced, and the performance of light incidence to the light guide plate is improved. Therefore, the brightness of the surface light source apparatus can be increased.

According to the second and third aspects of the present invention, warpage of the linear light source apparatus can be further suppressed.

According to the fourth aspect of the present invention, since the heat radiation sheet is provided, when a surface light source apparatus is produced by bringing the linear light source apparatus of the present invention into contact with a light guide plate, heat is less likely to be conducted to the light guide plate, and thus degradation of the light guide plate can be prevented.

According to the fifth aspect of the present invention, since the reflectors are provided, light can be effectively extracted upward, and the brightness of the linear light source apparatus can be improved.

According to the present invention, stress caused by thermal shrinkage of the sealing resin portion is relaxed. Therefore, even when adjacent reflectors are joined to each other as described in the sixth aspect of the invention, warpage of the linear light source apparatus can be sufficiently suppressed; i.e., the reflectors can be more readily formed.

When the reflectors are joined by the mediation of a rib as described in the seventh aspect of the present invention, since the rib adheres to the wiring substrate while stress is relaxed by means of a groove between the reflectors, adhesion between the reflectors and the wiring substrate can be improved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
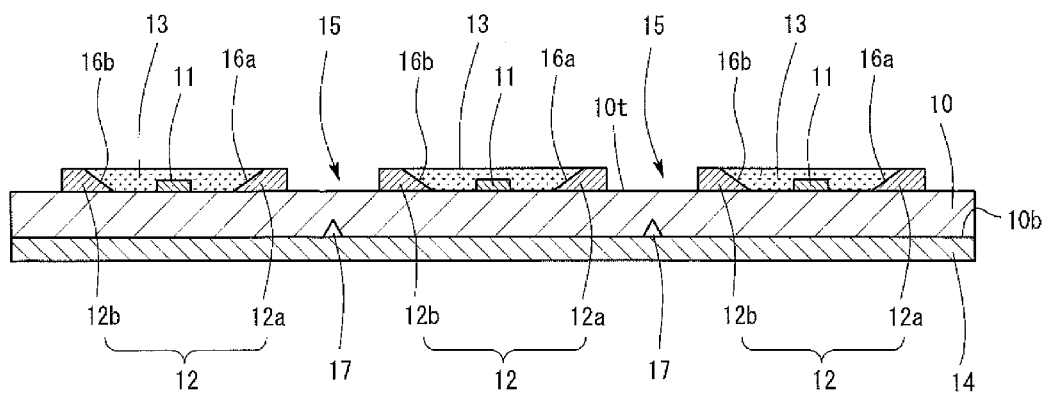
FIG. 1 is a cross-sectional view of the configuration of a linear light source apparatus 1 according to Embodiment 1.
Figure 2:
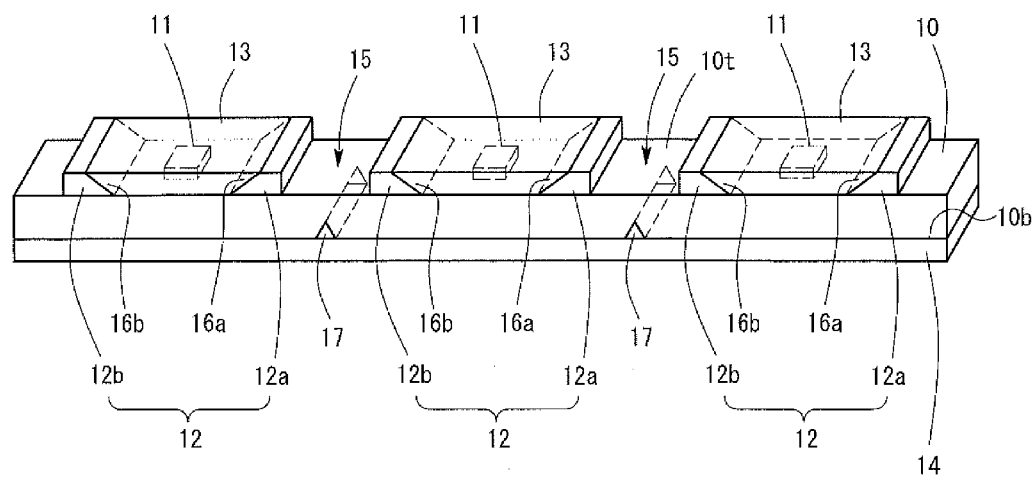
FIG. 2 is a perspective view of the configuration of the linear light source apparatus 1 according to Embodiment 1.

FIG. 1 is a cross-sectional view of the configuration of a linear light source apparatus 1 according to Embodiment 1, and FIG. 2 is a perspective view of the configuration of the linear light source apparatus 1. As shown in FIGS. 1 and 2, the linear light source apparatus 1 according to Embodiment 1 includes an elongated rectangular wiring substrate 10; a plurality of light-emitting devices 11 which are aligned on an imaginary straight line on the top surface 10t of the wiring substrate 10; reflectors 12 provided on the top surface 10t of the wiring substrate 10 such that each reflector corresponds to one light-emitting device; a sealing resin portion 13 which seals each of the light-emitting devices 11; and a heat radiation sheet 14 provided on the bottom surface 10a of the wiring substrate 10 (i.e., the surface opposite the surface on which the light-emitting devices are provided).

The wiring substrate 10 is an FR-5 substrate formed of a glass fabric substrate and a bismaleimide triazine resin. The wiring substrate 10 may be, for example, an FR-4 substrate formed of a glass fabric substrate and an epoxy resin. The wiring substrate 10 has a wiring pattern on a surface thereof. The wiring pattern is connected to the light-emitting devices 11 by means of bonding wires (not illustrated). The wiring substrate 10 has an elongated rectangular shape.

A plurality of grooves 17 are provided on the bottom surface 10a of the wiring substrate 10. Each groove 17 is formed so as to have a line shape and to extend in a lateral direction of the wiring substrate 10. The cross section of the groove 17 in a direction perpendicular to the line assumes a wedge shape. The grooves 17, each being located between adjacent light-emitting devices 11, are provided so as to be symmetrical with respect to the center of the wiring substrate 10. The grooves 17 are formed by means of, for example, a dicer, a cutter, or etching.

The shape and the position of the grooves 17 are not limited to those described above. For example, each groove 17 may have a dot shape. When each groove 17 is formed in a line shape, the cross section of the groove 17 in a direction perpendicular to the line may assume, in place of a wedge shape, for example, a rectangular shape, a semicircular shape, or a triangular shape. No particular limitation is imposed on the number of the grooves 17, so long as at least one groove is provided between adjacent light-emitting devices 11. The grooves are not necessarily symmetrical with respect to the center of the wiring substrate 10. However, in order to more effectively relax stress generated in the wiring substrate 10, preferably, a plurality of grooves 17 are provided such that the grooves 17 are located symmetrically with respect to the center of the wiring substrate 10. Particularly preferably, each groove 17 is provided at a position corresponding to a groove 15 between adjacent reflectors 12. When the wiring substrate 10 is formed of a single layer, the depth of each groove 17 is preferably ⅓ or less the thickness of the wiring substrate 10. Meanwhile, when the wiring substrate 10 is formed of a plurality of layers, the depth of each groove 17 is preferably equal to or smaller than the thickness of the first layer on the side of the bottom surface 10a of the wiring substrate 10. In the case where each groove 17 has a depth greater than this, the strength of the wiring substrate 10 may be lowered, and breakage, etc. may occur. In such a case, when the wiring substrate 10 is a multi-layer substrate, a wiring pattern provided in the substrate may be damaged, which is not preferred.

Each of the light-emitting devices 11 is a face-up type LED which comprises a Group III nitride semiconductor and which emits blue light. The light-emitting devices 11 are provided on the wiring substrate 10 so as to align on an imaginary straight line along a longitudinal direction of the wiring substrate 10. The wiring pattern of the wiring substrate 10 is connected to the n-electrode and p-electrode (not illustrated) of each light-emitting device 11 by means of bonding wires (not illustrated).

In Embodiment 1, each light-emitting device 11 is of a face-up type and is wire-bonded to the wiring substrate 10. However, the light-emitting device 11 may be of a flip-chip type or may have a structure in which electrical conduction is achieved in a vertical direction.

The reflectors 12 provided on the top surface 10t of the wiring substrate 10 are separated from one another by grooves 15 such that each reflector corresponds to one light-emitting device 11. The reflectors 12 are formed of, for example, a resin material such as polyphthalamide, liquid crystal polymer, epoxy resin, or silicone resin. Each reflector 12 is formed of two units 12a and 12b which face each other in a longitudinal direction of the linear light source apparatus 1 so as to sandwich one light-emitting device 11. The units 12a and 12b respectively have inclined surfaces 16a and 16b, which are located on the both sides of the light-emitting device 11 and inclined with respect to the main surface of the wiring substrate 10. The surfaces 16a and 16b are inclined such that the distance between them increases toward the top surface of the light-emitting device 11. The brightness of the linear light source apparatus 1 is increased and brightness unevenness is reduced by reflecting light from the light-emitting device 11 upward by means of the inclined surfaces 16a and 16b.

In Embodiment 1, the reflectors 12 are provided such that each reflector corresponds to one light-emitting device 11. However, the reflectors 12 may be provided such that each reflector corresponds to a plurality of light-emitting devices (e.g., two or three light-emitting devices). When a plurality of light-emitting devices are provided so as to correspond to a single reflector, the light-emitting devices may be aligned along a longitudinal direction of the wiring substrate, or may be arranged in another manner.

Figure 3:
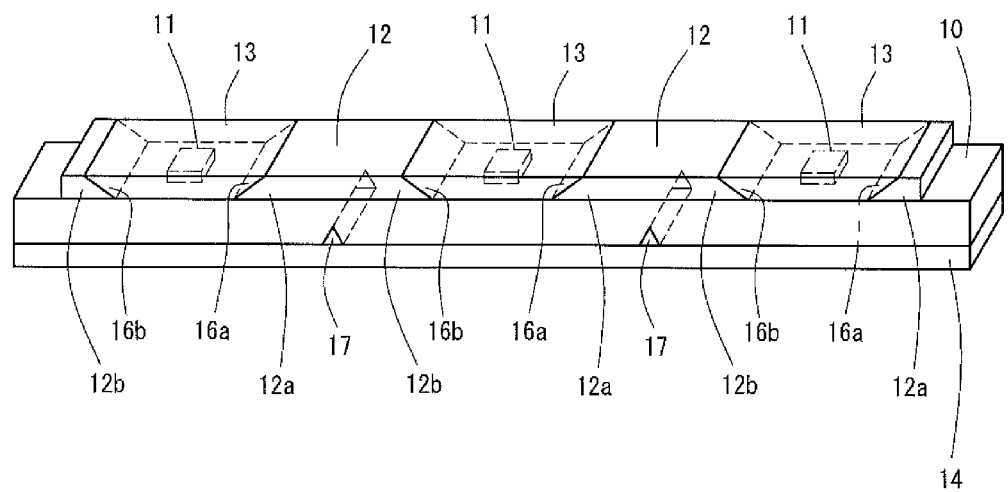
FIG. 3 is a perspective view of the configuration of a linear light source apparatus 1 according to another embodiment.

As shown in FIG. 3 (perspective view), adjacent reflectors 12 may be joined integrally without being separated from each other (i.e., the grooves 15 may be omitted). Even when the grooves 15 are omitted, stress can be sufficiently relaxed by the effects of the present invention. Thus, when the grooves 15 are not provided, the reflectors 12 can be readily formed.

Figure 4:
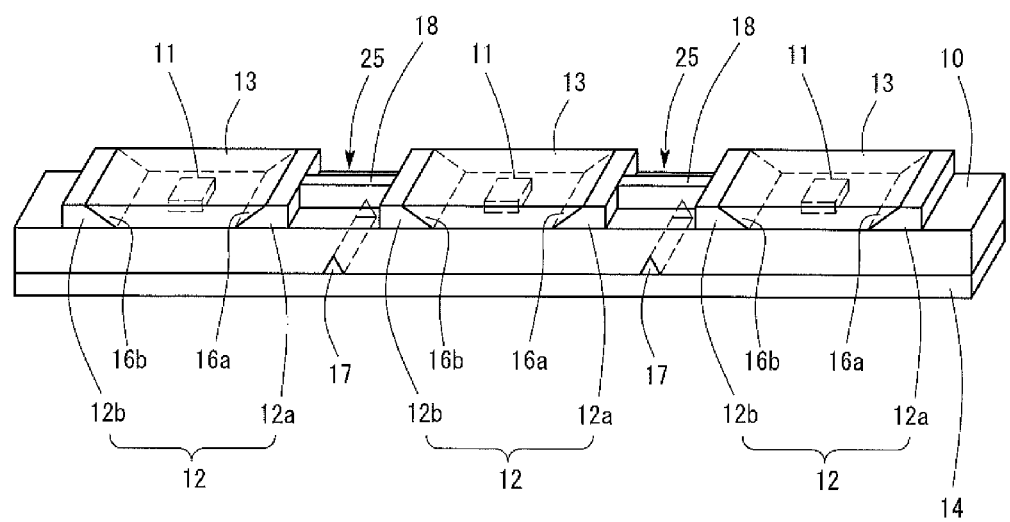
FIG. 4 is a perspective view of the configuration of a linear light source apparatus 1 according to yet another embodiment.

As shown in FIG. 4 (perspective view), a rib 18 may be formed between adjacent reflectors 12 through provision of a groove 25, to thereby join the adjacent reflectors 12 by means of the rib 18. While stress is relaxed by means of the groove 25, the rib 18 is caused to adhere to the wiring substrate 10, to thereby improve adhesion between the reflectors 12 and the wiring substrate 10.

The sealing resin portion 13 is formed of a silicone resin mixed with a yellow fluorescent material, and seals each light-emitting device 11. The sealing resin portion 13 may be formed of, for example, an epoxy resin. The sealing resin portion 13 is provided for protecting the light-emitting device 11 and bonding wires. Also, the sealing resin portion 13 is provided for converting a portion of blue light emitted from the light-emitting device 11 to yellow light, and generating white light through mixing of blue light and yellow light. The sealing resin portion 13 is formed so as to fill a space defined by the inclined surfaces 16a and 16b of each reflector 12 and the surface of the wiring substrate 10 on which the light-emitting devices 11 are provided. The sealing resin portion 13 is formed by potting a viscous silicone resin, and then curing the resin through thermal treatment. Since the silicone resin shrinks during this thermal treatment, stress is generated in the wiring substrate 10 so that the wiring substrate 10 warps so as to be convex in a downward direction from the surface on which the light-emitting device 11 is mounted toward the bottom surface of the substrate 10.

The sealing resin portion 13 may be mixed with a reflective material for scattering light emitted from the light-emitting device 11. The reflective material may be particles of, for example, silica.

The heat radiation sheet 14 is provided on the entire bottom surface 10a of the wiring substrate 10. With provision of the heat radiation sheet 14, stress generated in the wiring substrate 10 is relaxed, and warpage of the linear light source apparatus 1 is suppressed. The heat radiation sheet 14 is formed of a material having thermal conductivity higher than that of the wiring substrate 10 (e.g., aluminum or copper).

The reinforcing sheet of the linear light source apparatus is not necessarily the heat radiation sheet 14, so long as stress generated in the wiring substrate 10 can be relaxed.

Operation of the linear light source apparatus 1 will next be described. When voltage is applied to the linear light source apparatus 1, and electric current flows through each of the light-emitting devices 11 via the wiring pattern of the wiring substrate 10, blue light is emitted radially from the light-emitting device 11. A portion of the emitted light transmits through the sealing resin portion 13 and is radiated upward. Meanwhile, the remaining portion of the emitted light reaches the inclined surfaces 16a and 16b of the reflector 12 after having transmitted through the sealing resin portion 13, and is reflected by the inclined surfaces 16a and 16b and is radiated upward. Since a portion of blue light is converted to yellow light by means of the yellow fluorescent material contained in the sealing resin portion 13, white light is generated through mixing of blue light with yellow light. Thus, blue light emitted from the light-emitting device 11 is converted to white light, and the white light is emitted upward. Since the light-emitting devices 11 are aligned linearly, light in aligned form is also emitted from the light-emitting devices 11. Therefore, the linear light source apparatus 1 emits white light in aligned form.

In the linear light source apparatus 1 according to Embodiment 1, the grooves 17 are provided on the bottom surface 10a of the wiring substrate 10. Therefore, stress generated in the wiring substrate 10 is relaxed, and warpage of the linear light source apparatus 1 is suppressed. Also, relaxation of stress generated in the wiring substrate 10 is achieved by providing the heat radiation sheet 14 on the entire bottom surface 10a of the wiring substrate 10. Thus, since warpage of the linear light source apparatus 1 is suppressed, when a surface light source apparatus is produced by combining the linear light source apparatus 1 with a light guide plate, adhesion between the linear light source apparatus 1 and the light guide plate is enhanced, and the performance of light incidence to the light guide plate is improved. Therefore, the brightness of the surface light source apparatus can be increased. With provision of the heat radiation sheet 14, heat is less likely to be conducted to the light guide plate, and thus degradation of the light guide plate can be prevented.

The linear light source apparatus 1 according to Embodiment 1 is configured so as to emit white light by employing a blue light LED as the light-emitting device 11, and incorporating a yellow fluorescent material into the sealing resin portion 13. However, the color of light emitted from the light-emitting device 11 and the color of light emitted from the fluorescent material are not limited to the aforementioned examples. For example, the linear light source apparatus 1 may be configured so as to emit white light by employing a blue light LED as the light-emitting device, and incorporating two types of fluorescent materials (i.e., a red fluorescent material and a green fluorescent material) into the sealing resin portion 13. Alternatively, the linear light source apparatus 1 may be configured so as to emit white light by providing two types of light-emitting devices (a blue LED and a green LED) in each reflector 12 and incorporating a red fluorescent material into the sealing resin portion 13; by providing two types of light-emitting devices (a blue LED and a red LED) in each reflector 12 and incorporating a green fluorescent material into the sealing resin portion 13; or by providing three types of light-emitting devices (a blue LED, a green LED, and a red LED) in each reflector 12.

Figure 5:
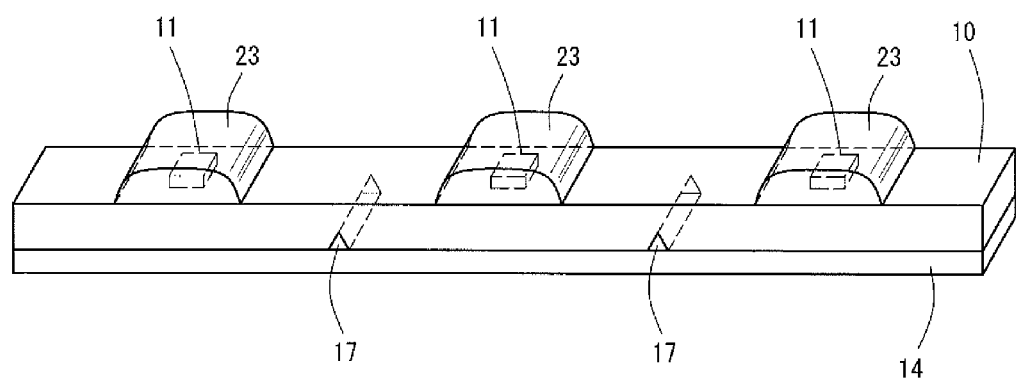
FIG. 5 is a perspective view of the configuration of a linear light source apparatus 1 according to yet another embodiment.

The linear light source apparatus according to Embodiment 1 includes the reflectors 12, but the reflectors 12 are not necessarily provided. As shown in FIG. 5, the reflectors 12 may be omitted from the linear light source apparatus according to Embodiment 1, and each light-emitting device 11 may be sealed with a sealing resin portion 23 having a semicircular columnar shape. Also in this case, warpage of the linear light source apparatus can be suppressed by the effects of the grooves 17 and the heat radiation sheet 14.

The linear light source apparatus of the present invention can be combined with a light guide plate to produce a surface light source apparatus, and the surface light source apparatus can be employed as a backlight source of a small-sized liquid crystal display panel of, for example, a cellular phone or a digital camera.

What is claimed is:

1. A linear light source apparatus comprising:
   a wiring substrate with a rectangular shape on a top surface of which a wiring pattern is formed;
   a plurality of light-emitting devices which are provided on the top surface of the wiring substrate so as to align along a longitudinal direction of the wiring substrate, and which are connected to the wiring pattern of the wiring substrate;
   a sealing resin portion which seals each light-emitting device;
   a groove formed on a bottom surface of the wiring substrate, which bottom surface is opposite the top surface on which the light-emitting devices are provided, and each groove being located between adjacent light-emitting devices; and
   a reinforcing sheet is provided on the bottom surface; and
   wherein each groove extends in a lateral direction of the wiring substrate and has a line shape.

2. A linear light source apparatus according to claim 1, wherein the grooves are provided so as to be symmetrical with respect to the center of the wiring substrate.

3. A linear light source apparatus according to claim 2, wherein the reinforcing sheet comprises a heat radiation sheet having a thermal conductivity higher than a thermal conductivity of the wiring substrate.

4. A linear light source apparatus according to claim 3, further comprising:
   reflectors provided on the top surface of the wiring substrate, each of the reflectors being formed of two units whose respective inclined surfaces face each other in a longitudinal direction of the wiring substrate, and the reflectors being separated from each other such that one or more light-emitting devices are provided between the two inclined surfaces;
   wherein the sealing resin portion is formed so as to fill a space defined by the two inclined surfaces of each reflector and the top surface of the wiring substrate.

5. A linear light source apparatus according to claim 4, wherein adjacent reflectors are joined to each other.

6. A linear light source apparatus according to claim 5, wherein the adjacent reflectors are joined by the mediation of a rib.

7. A linear light source apparatus according to claim 2, further comprising:
   reflectors provided on the top surface of the wiring substrate, each of the reflectors being formed of two units whose respective inclined surfaces face each other in a longitudinal direction of the wiring substrate, and the reflectors being separated from each other such that one or more light-emitting devices are provided between the two inclined surfaces;
   wherein the sealing resin portion is formed so as to fill a space defined by the two inclined surfaces of each reflector and the top surface of the wiring substrate.

8. A linear light source apparatus according to claim 7, wherein adjacent reflectors are joined to each other.

9. A linear light source apparatus according to claim 8, wherein the adjacent reflectors are joined by the mediation of a rib.

10. A linear light source apparatus according to claim 1, wherein the reinforcing sheet comprises a heat radiation sheet having a thermal conductivity higher than a thermal conductivity of the wiring substrate.

11. A linear light source apparatus according to claim 1, further comprising:
reflectors provided on the top surface of the wiring substrate, each of the reflectors being formed of two units whose respective inclined surfaces face each other in a longitudinal direction of the wiring substrate, and the reflectors being separated from each other such that one or more light-emitting devices are provided between the two inclined surfaces;
wherein the sealing resin portion is formed so as to fill a space defined by the two inclined surfaces of each reflector and the top surface of the wiring substrate.

12. A linear light source apparatus according to claim 11, wherein adjacent reflectors are joined to each other.

13. A linear light source apparatus according to claim 12, wherein the adjacent reflectors are joined by the mediation of a rib.

14. A linear light source apparatus according to claim 1, further comprising:
reflectors provided on the top surface of the wiring substrate, each of the reflectors being formed of two units whose respective inclined surfaces face each other in a longitudinal direction of the wiring substrate, and the reflectors being separated from each other such that one or more light-emitting devices are provided between the two inclined surfaces;
wherein the sealing resin portion is formed so as to fill a space defined by the two inclined surfaces of each reflector and the top surface of the wiring substrate.

15. A linear light source apparatus according to claim 14, wherein adjacent reflectors are joined to each other.

16. A linear light source apparatus according to claim 15, wherein the adjacent reflectors are joined by the mediation of a rib.

* * * * *